(12) United States Patent
Cain et al.

(10) Patent No.: US 7,129,545 B2
(45) Date of Patent: Oct. 31, 2006

(54) CHARGE MODULATION NETWORK FOR MULTIPLE POWER DOMAINS FOR SILICON-ON-INSULATOR TECHNOLOGY

(75) Inventors: David A. Cain, South Burlington, VT (US); Jeffrey P. Gambino, Westford, VT (US); Norman J. Rohrer, Underhill, VT (US); Daryl M. Seitzer, Huntington, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,563

(22) Filed: Feb. 24, 2005

(65) Prior Publication Data

US 2006/0187596 A1 Aug. 24, 2006

(51) Int. Cl.
*H02H 9/00* (2006.01)
(52) U.S. Cl. .......................... 257/355; 361/56
(58) Field of Classification Search ............... 257/355; 361/56
See application file for complete search history.

(56) References Cited

U.S. PATENT DOCUMENTS

| 4,989,057 | A | 1/1991 | Lu |
| 5,214,562 | A | 5/1993 | Levi |
| 5,436,189 | A | 7/1995 | Beasom |
| 5,446,320 | A | 8/1995 | Schamberg et al. |
| 5,610,790 | A * | 3/1997 | Staab et al. .................. 361/56 |
| 5,977,606 | A | 11/1999 | Sakurai et al. |
| 6,034,397 | A | 3/2000 | Voldman |
| 6,184,565 | B1 | 2/2001 | Beasom |
| 6,208,494 | B1 * | 3/2001 | Nakura et al. ................ 361/56 |
| 6,369,994 | B1 | 4/2002 | Voldman |
| 6,541,814 | B1 | 4/2003 | Cao et al. |
| 6,645,820 | B1 | 11/2003 | Peng et al. |
| 6,649,944 | B1 | 11/2003 | Ker et al. |
| 2001/0043112 | A1 | 11/2001 | Voldman |
| 2002/0109153 | A1 | 8/2002 | Ker et al. |
| 2002/0149263 | A1 | 10/2002 | Blanco et al. |
| 2003/0062540 | A1 | 4/2003 | Ker et al. |
| 2003/0080386 | A1 | 5/2003 | Ker et al. |
| 2003/0139024 | A1 | 7/2003 | Ker et al. |
| 2003/0235994 | A1 | 12/2003 | Pan et al. |
| 2004/0027742 | A1 | 2/2004 | Miller et al. |

* cited by examiner

*Primary Examiner*—Thomas L. Dickey
(74) *Attorney, Agent, or Firm*—Wood, Phillips, Katz, Clark & Mortimer

(57) ABSTRACT

An SOI integrated circuit includes ESD protection on an SOI chip. A first power domain and a second power domain are provided in the SOI chip. In one embodiment, a charge modulation network in the SOI chip between the first power domain and the second power domain mitigates accumulation of electrical charge in an electrically isolated region of the SOI chip. In another embodiment, an ESD protection device in the SOI chip electrically connects the first power domain and the second power domain via a low metal layer to provide a discharge path for accumulated charge.

8 Claims, 10 Drawing Sheets

CHARGE MODULATION NETWORK FOR MULTIPLE POWER DOMAINS FOR SILICON-ON-INSULATOR TECHNOLOGY

FIELD OF THE INVENTION

The present invention generally relates to integrated circuits, and more particularly to minimize charging effects in such integrated circuits.

BACKGROUND OF THE INVENTION

Charge damage from plasma processes can degrade yield and reliability of integrated circuits. For devices fabricated on bulk Si, a charge differential can develop between the gate electrode and the substrate, resulting in large current flow through the gate dielectric, and hence damage to the gate dielectric. As a result, gates in bulk Si devices are often connected to protect diodes, that equalize charge between the gate and substrate during plasma processing, thereby protecting the gate dielectric from plasma damage.

For devices fabricated on silicon-on-insulator (SOI) substrates, the device Si is generally isolated from the substrate. However, charge damage can occur in SOI devices if the gate charges to a different potential than the diffusions. Such differential charging can occur if the gate and diffusions are connected to different power or ground networks. Power and ground networks for different macros within a large integrated circuit are generally not connected until the upper wiring or metal layers because of hierarchical design practices. This differential charging can result in damage to the gate dielectric, and reduces yield.

At present, there is no method to protect devices on SOI from differential charging when gates and diffusions are connected to different power or ground grids.

As electronic components are getting smaller and smaller along with the internal structures in integrated circuits, it is getting easier to either completely destroy or otherwise impair electronic components from charge buildup during semiconductor processes.

Charge buildup from plasma etching can lead to destruction of semiconductor components. In SOI technology, there is no natural path to the substrate because of the buried oxide (BOX) region. Charging issues which are normally not a concern in bulk CMOS can become an issue in SOI technology.

A key issue is the problem of a power grid which is isolated or disconnected. In a wafer environment, a segmented section of a power grid can be isolated from a second segment. In an RF SOI chip, eight different power supplies are possible with different power grid domains. Different domains can exist in voltage islands, and as well as other implementations where the power grids are isolated.

In semiconductor processing, SOI technology is becoming increasingly important since it permits the formation of high-speed integrated circuits. In SOI technology, a relatively thin layer of semiconducting material, e.g. Si, overlays a layer of insulating material (buried oxide region). This relatively thin layer of semiconducting material is generally the area wherein active devices are formed in SOI devices. Devices formed on SOI offer many advantages over their bulk Si counterparts, including higher performance, absence of latch-up, higher packing density and low voltage applications.

Despite the advantages obtained using SOI technology, SOI circuits, like other electronic devices, are susceptible to electrostatic discharge (ESD), i.e. a surge in voltage (negative or positive) that occurs when a large amount of current is applied in the circuit. Moreover, the handling of SOI devices themselves may lead to charging of the substrate.

To discharge electrostatic impulses, ESD protection schemes need a low voltage turn-on and a high current drive (the ability to generate or sink a large amount of current before a large amount of negative or positive voltage is developed). Traditional bulk overvoltage protection schemes, such as diodes, do not work well on SOI because of the presence of the relatively thin diffusion over the buried oxide layer. That is, conventional diodes on SOI devices have small current drivability because the current is carried laterally (limited by the thickness of the semiconductor material).

One approach for protecting SOI circuitry from ESD is found in U.S. Pat. No. 4,989,057 to Lu. The Lu reference discloses a gated diode, which could be used for ESD design. The gate diode disclosed in Lu consists of a floating-body SOI transistor, with the gate connected to a signal pad. Although the diode disclosed in Lu can provide some ESD protection, the disclosed diode does not allow for obtaining ideal diode characteristics. Some reasons preventing ideal diode characteristics with the diodes disclosed in Lu include: (1) alignment tolerance of the substrate causes large process-induced variations; and (2) the conventional diode structure may be a polysilicon diode, which receives extensions and halo implants (implants normally utilized in deep submicron MOSFETS) that degrades the ideal characteristics on SOI.

Other ESD protection schemes for the front side of the SOI wafer are also known. Common to each is that the energy developed across prior art ESD protection schemes can be substantial. Thus, the heat generated by such ESD protection schemes must be dissipated by the relatively thin semiconducting layer. In cases wherein the heat becomes too excessive, destruction of the SOI circuit may occur.

In view of the above drawbacks with prior art ESD protection schemes, there is a need for developing new and improved ESD protection schemes that can be used for dissipating electrostatic charge from the substrate of an SOI wafer.

SUMMARY OF THE INVENTION

The present invention is directed to a method and apparatus to protect against charging damage for multiple domains and system-on-chip architecture for silicon insulator technology.

Broadly, in accordance with one aspect of the invention, there is disclosed a method of implementing electrostatic discharge protection in a silicon-on-insulator (SOI) integrated circuit comprising: providing a first power domain and a second power domain in the SOI integrated circuit; and providing a charge modulation network in the SOI integrated circuit between the first power domain and the second power domain to mitigate accumulation of electrical charge in an electrically isolated region of the SOI integrated circuit.

It is a feature of the invention that providing a charge modulation network comprises providing a gated resistor between the first power domain and the second power domain.

It is another feature of the invention that the charge modulation network provides a resistance between the first power domain and the second power domain responsive to a sensed differential voltage between the first power domain and the second power domain.

It is a further feature of the invention to provide a bypass network across the charge modulation network to protect the charge modulation network.

It is another feature of the invention to connect an enable circuit to the charge modulation network to selectively enable operation of the charge modulation network.

There is disclosed in accordance with another aspect of the invention an SOI integrated circuit including ESD protection comprising an SOI chip. A first power domain and a second power domain are provided in the SOI chip. A charge modulation network in the SOI chip between the first power domain and the second power domain mitigates accumulation of electrical charge in an electrically isolated region of the SOI chip.

There is disclosed in accordance with another aspect of the invention an SOI integrated circuit including ESD protection comprising an SOI chip. A first power domain and a second power domain are provided in the SOI chip. An ESD protection device in the SOI chip electrically connects the first power domain and the second power domain via a low metal layer to provide a discharge path for accumulated charge.

It is a feature of the invention to provide a logic signal line between the first and second power domains. The ESD protection device electrically connects the first power domain and the second power domain at a metal level lower than or equal to the highest metal level on which the logic signal is routed to provide a discharge path for accumulated charge.

It is another feature of the invention that the ESD protection device comprises one or more diodes.

There is disclosed in accordance with a further aspect of the invention a method of implementing electrostatic discharge protection in an SOI integrated circuit comprising: defining a plurality of SOI devices in the integrated circuit; identifying a plurality of power domains in the SOI integrated circuit; determining if a logic signal traverses more than one of the plurality of power domains; determining if a circuit path for the logic signal is timing critical; and connecting a power supply wire for an ESD protection network at a metal level lower than or equal to a highest metal level on which the logic signal is routed if the logic signal traverses more than one power domain and if the circuit path is timing critical.

It is another feature of the invention to connect a power supply wire at a metal level higher than a metal level on which a power supply connection for the ESD protection network is routed if the logic signal traverses a single power domain or if the circuit path is not timing critical.

Further features and advantages of the invention will be readily apparent from the specification and from the drawings.

DETAILED DESCRIPTION OF THE INVENTION

Figure 1:
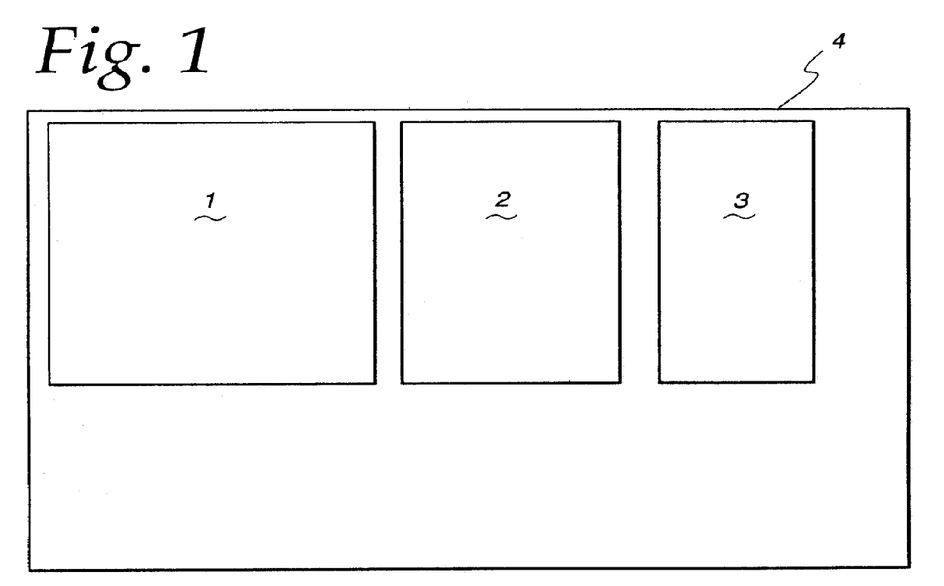
FIG. 1 is a generalized plan view of a silicon-on-insulator (SOI) chip or wafer.

Referring initially to FIG. 1, a plurality of blocks 1, 2 and 3 are illustrated as a sub part of a larger block 4. The larger block 4 may comprise, for example, a wafer with blocks 1, 2 and 3 comprising individual chips on the wafer. Alternatively, the block 4 may comprise a chip with the blocks 1, 2 and 3 representing circuit domains or regions on the chip. The blocks 1, 2 and 3 particularly represent the separation of grounds and power domains in manufacture of a silicon-on-insulator (SOI) chip. For example, the blocks 1, 2 and 3 may comprise areas, in the form of logic and/or memory, on the chip 4 supplied through separate, dedicated power feeds, also known as voltage islands. Alternatively, they may comprise areas within an island fed by the same voltage source but independently controlled via an inter-island header switch, referred to as a power domain. The teachings of the present invention are applicable to plural power domains and/or voltage islands, and for simplicity, reference to either herein to be considered to include reference to the other. The various chips and/or domains are connected at higher metal levels, as necessary, during subsequent processing steps or during packaging. The present invention is directed to a method and apparatus for providing electrostatic discharge (ESD) protection during processing.

Figure 2:
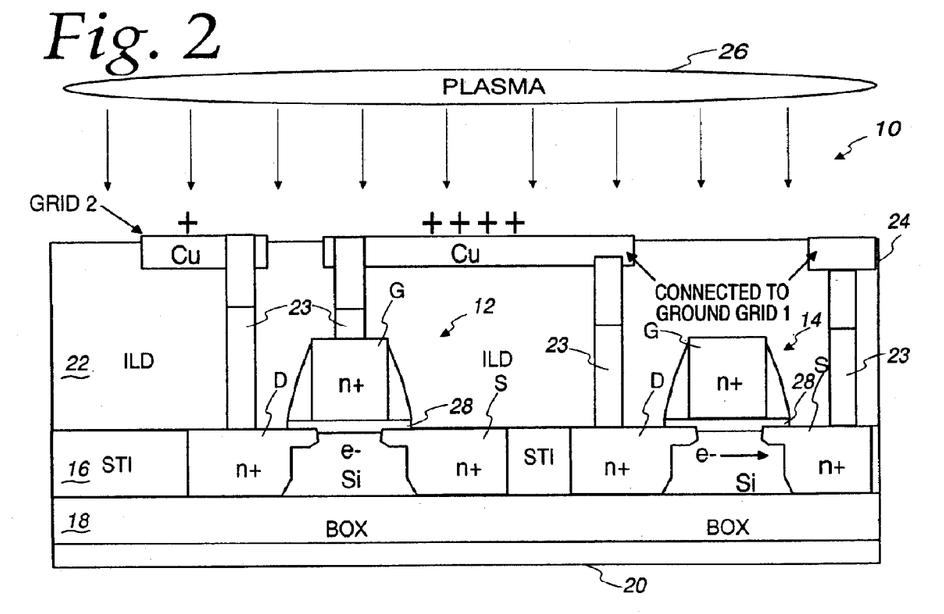
FIG. 2 is a cross section of an SOI chip.

Referring to FIG. 2, a cross section of an SOI integrated circuit 10 during plasma processing is illustrated. The circuit 10 includes first and second FETs 12 and 14, each including a drain D, a gate G and a source S, as is conventional. The circuit 10 has a silicon layer 16 with shallow trench isolation (STI) regions formed therein. The silicon layer 16 is formed on a buried oxide layer 18 and a substrate 20. An interlevel dielectric (ILD) layer 22 is formed on the silicon layer 16. In damascene processing, troughs in the ILD are filled with copper 23 and connect to a copper layer 24 to provide select electrical connections, as is known. At the processing stage illustrated in FIG. 2, the drain D of the first FET 12 is connected to a ground labeled grid 2. The gate of the first FET 12 is connected to the drain of the second FET 14. The drain and source of the second FET are connected to ground labeled grid 1. During an etching process, copper in the layer 24 is removed by, for example, RF generated plasma as illustrated at 26 which can provide differential charging. This differential charging can be due to various factors, and can result in damage to a gate dielectric 28 and thus destroy the FETs 12 and 14, as noted above. For example, if the regions are different sizes, then there may be a voltage differential between planes in plasma processing as smaller areas collect less charge.

Figure 3:
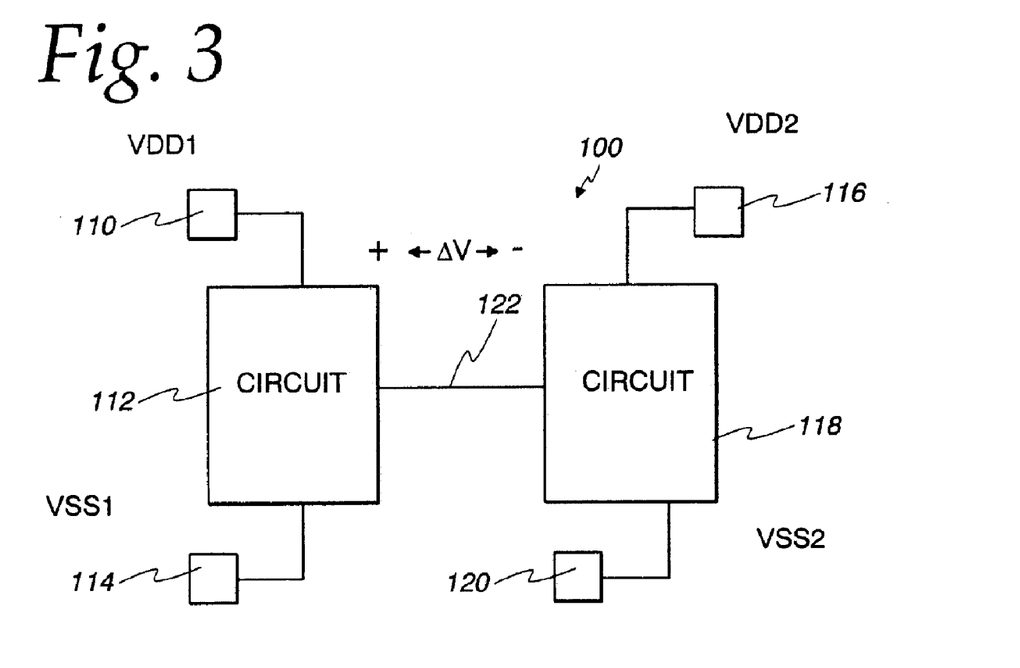
FIG. 3 is a block diagram of an SOI chip with a plurality of power domains.
Figure 4:
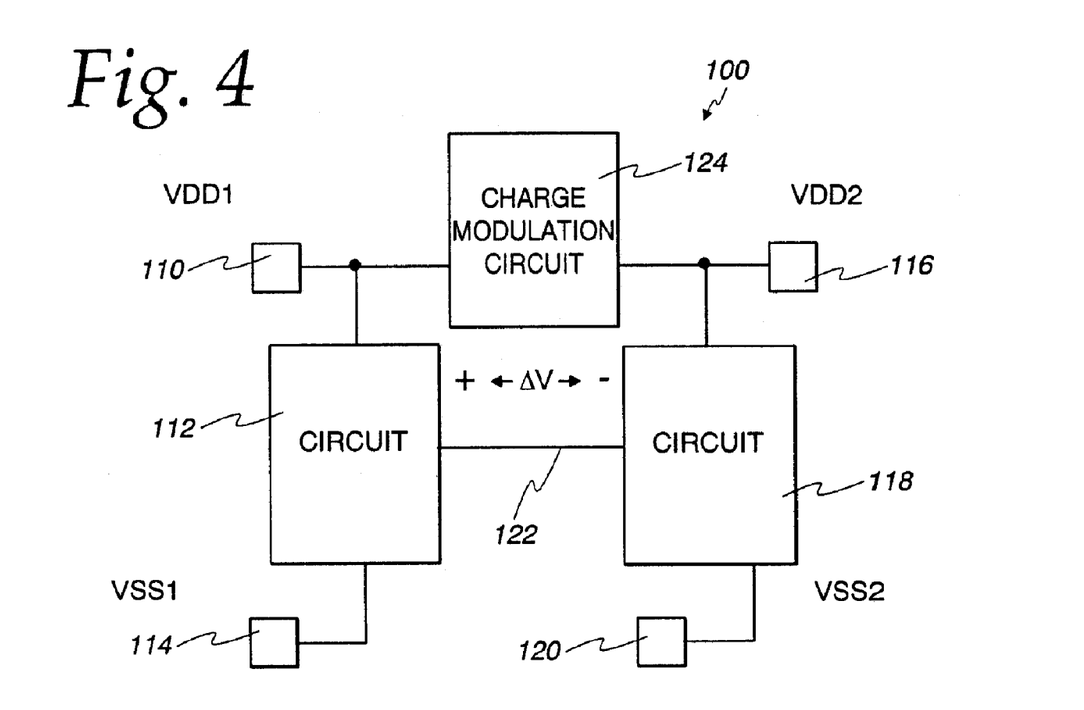
FIG. 4 is a block diagram of an example of implementation of the charge modulation for electrostatic discharge (ESD) protection in a SOI chip having different power domains.

FIG. 3 illustrates a block diagram of an SOI chip 108. A block 110 represents a first power domain VDD1. This is connected to a circuit 112 which is in turn connected to a block 14 representing a ground VSS1. Similarly, a block 16 represents a second power domain VDD2 which is connected to a second circuit 118 connected to a block 120 representing a second ground VSS2. The circuits 112 and 118 are connected by a line 122 representing a circuit or connector. For example, the circuits 112 and 118 could correspond to the FETs 12 and 14 of FIG. 2 with the line 122 representing the gate to drain connection. The circuits 112 and 118 being connected to different power domains 110 and 116, could be subject to differential voltage, as illustrated. In accordance with the invention, and with reference to FIG. 4, a charge modulation circuit 124 is electrically connected between the power domains 110 and 116 to discharge electrostatic impulses. The charge modulation circuit 124 comprises a neutralization circuit which mitigates accumulation of electrical charge in electrically isolated regions of the integrated circuit to protect against damage caused by electrostatic discharge (ESD).

Figure 5:
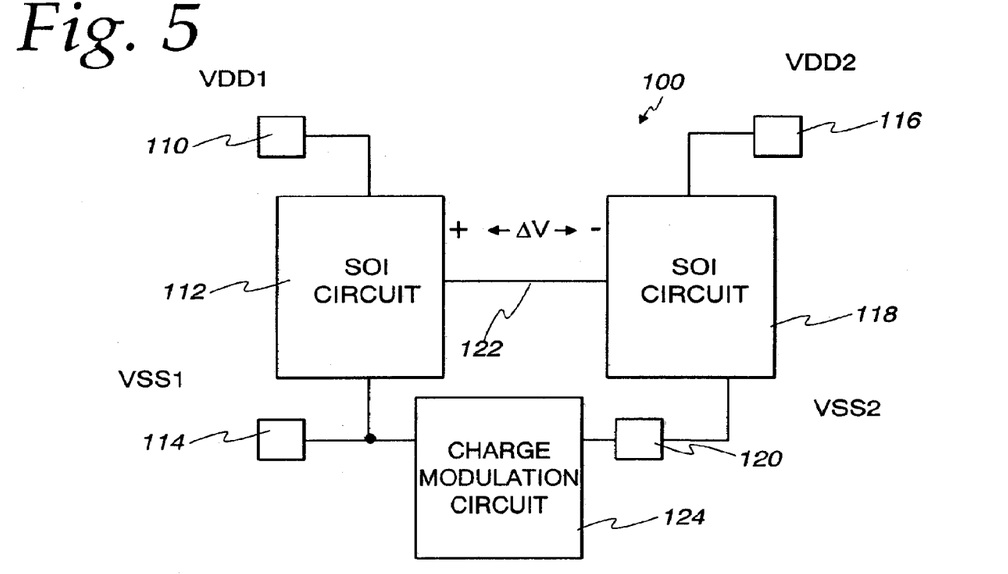
FIG. 5 is a block diagram of an example of implementation of the charge modulation for electrostatic discharge (ESD) protection in a SOI chip having isolated grounds.

FIG. 5 is an alternative embodiment of the chip 100 which shows the charge modulation circuit 124 connected between the grounds 114 and 120. This is used where isolated grounds are present as there are few current paths between grounds in an SOI chip or with triple well circuits.

Figure 6:
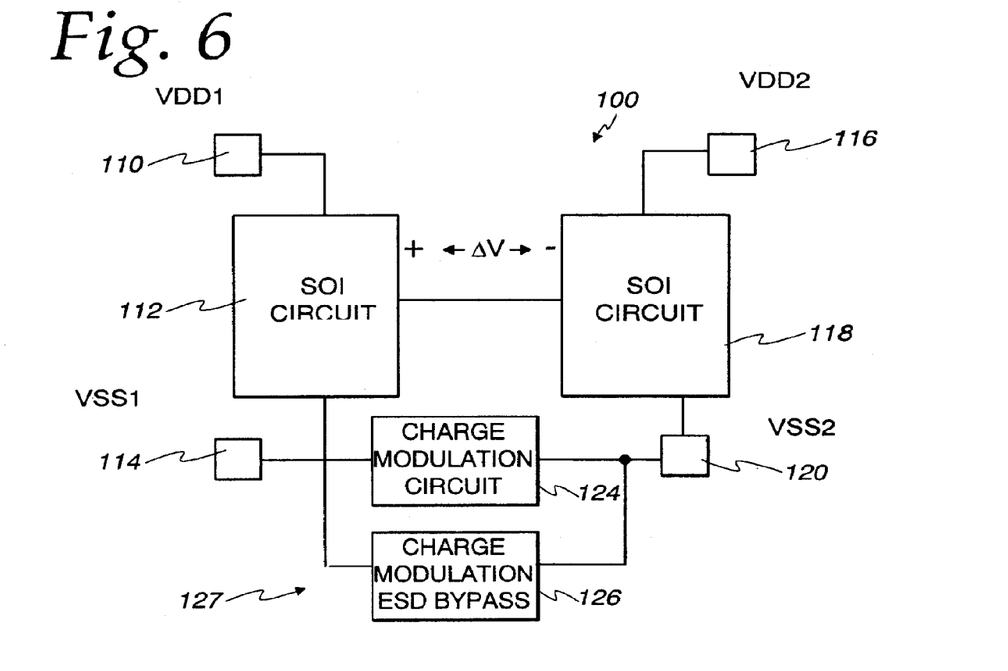
FIG. 6 is a block diagram of an example of implementation of the charge modulation for electrostatic discharge (ESD) protection in a SOI chip having isolated grounds and including an ESD bypass circuit.

In some circuit designs it is necessary to isolate voltages in final processing stages. Therefore, short circuit connections are not desirable in the charge modulation circuit 124. Instead, circuit devices should be used that are small or resistive or have resistive characteristics. Devices should not be used which are low in impedance. However, such circuits cannot protect against fast response due, for example, to arcing. In accordance with the invention, and with reference to FIG. 6, a charge modulation network ESD bypass circuit 126 can be connected across the charge modulation circuit 124, to form a charge modulation network 127. The charge modulation circuit 124 provides ESD protection for the circuits 112 and 118 from differential voltages. The charge modulation network ESD bypass circuit 126 protects the charge modulation circuit 124 and provides high current ESD response and rapid response for the circuits 112 and 118.

As described, the charge modulation network 127 is an integral component of the SOI chip 100. However, it may be desirable to prevent noise coupling during use. Also, the power domains or voltage islands might use different voltages. Thus, in accordance with the invention, and with reference to FIG. 7, the charge modulation network 127 includes a charge modulation enable circuit 128 connected to the charge modulation circuit 124 and the charge modulation network ESD bypass circuit 126. The charge modulation enable circuit 128 may be connected to an input block 130 for external control to selectively enable or disable the charge modulation network 127.

Figure 8:
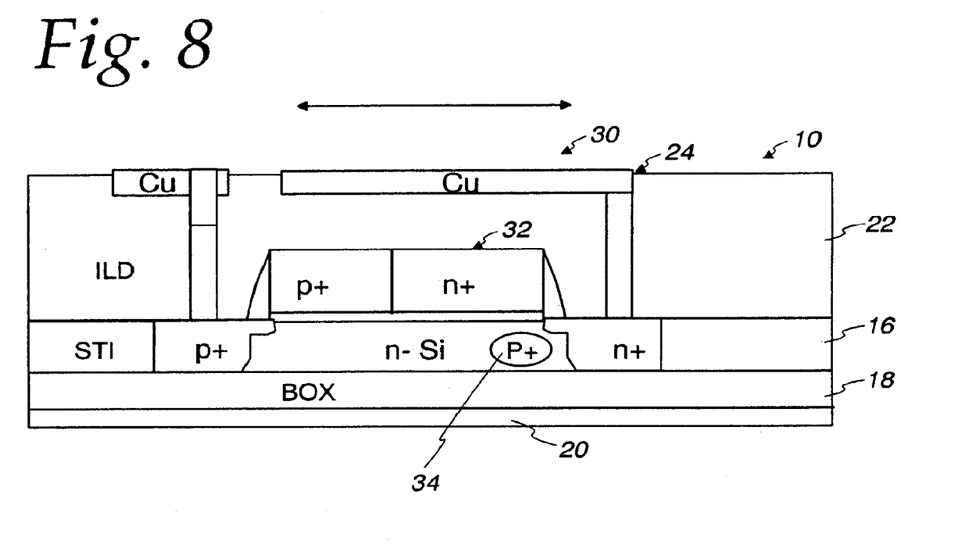
FIG. 8 is a cross section of an SOI device in the form of an SOI long channel lubistor for the charge modulation network.

Referring to FIG. 8, a portion of the SOI chip 10 is illustrated including one type of element 30 providing charge modulation between circuits, such as the circuits 112 and 118, discussed above. The element 30 comprises a long channel lateral unidirectional BJT-type insulated gate transistor (lubistor) 32. If made physically long enough, then the device will be resistive. Resistance can be increased by halo doping concentration as at 34 providing a resistive edge implant.

Figure 9:
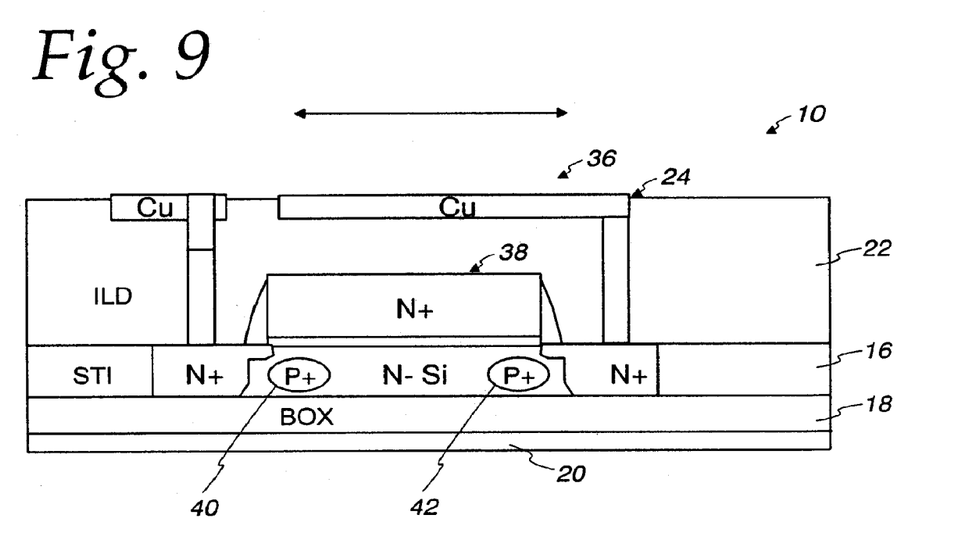
FIG. 9 is a cross section of an SOI device of a SOI long channel gated resistor for the charge modulation network.

Referring to FIG. 9, a portion of the SOI chip 10 is illustrated including an alternative charge modulation element 36. The element 36 comprises a long channel gated resistor 38 including halo doping at 40 and 42 to provide resistive implants.

Figure 7:
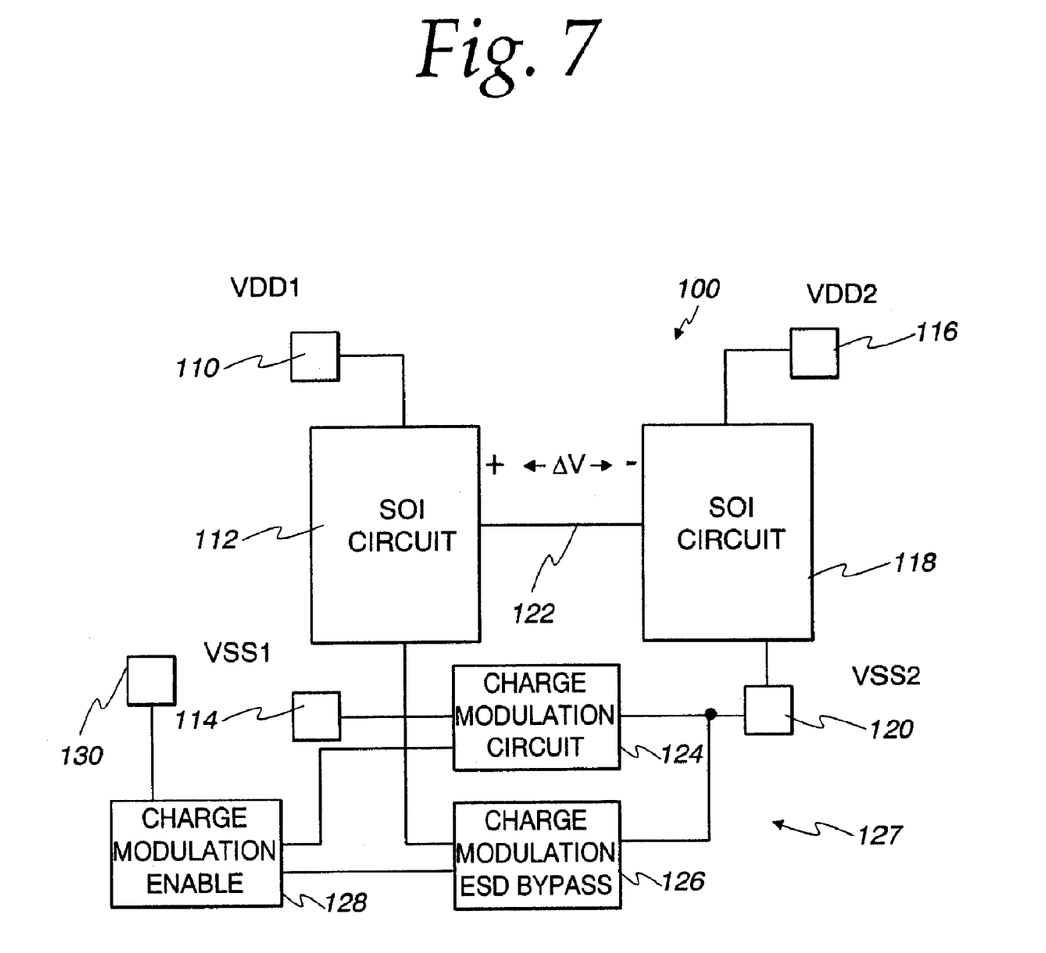
FIG. 7 is a block diagram of an example of implementation of the charge modulation for electrostatic discharge (ESD) protection in a SOI chip having isolated grounds and including an ESD bypass and a charge modulation circuit enable.
Figure 10:
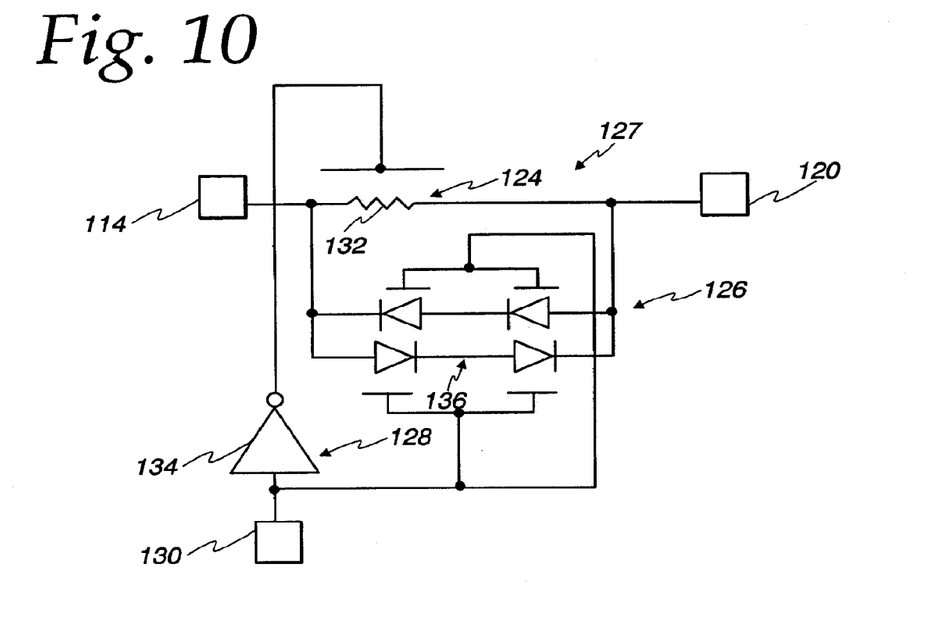
FIG. 10 is an electrical schematic of a charge modulation network and ESP bypass circuit in accordance with the invention.

With reference to FIG. 10, an electrical schematic illustrates a circuit embodiment of the charge modulation network 127 shown in block diagram form in FIG. 7. Particularly, the charge modulation circuit 124 comprises a gated resistor 130 connected between the grounds 114 and 120. The gated resistor 132 provides high resistance at low DC voltages. The charge modulation enable circuit 128 comprises an inverter 134 connected between the input 130 and the gate of the gated resistor 132. The charge modulation network ESD bypass circuit 126 comprises a plurality of gated diodes 136 with two pairs of series connected diodes connected in opposite directions. This allows current to flow bidirectionally. The diodes 136 are gated by the input 130. As such, the input 130 is used to turn one of the charge modulation circuit 124 and the charge modulation network ESD bypass circuits 126 on and the other off.

Figure 11:
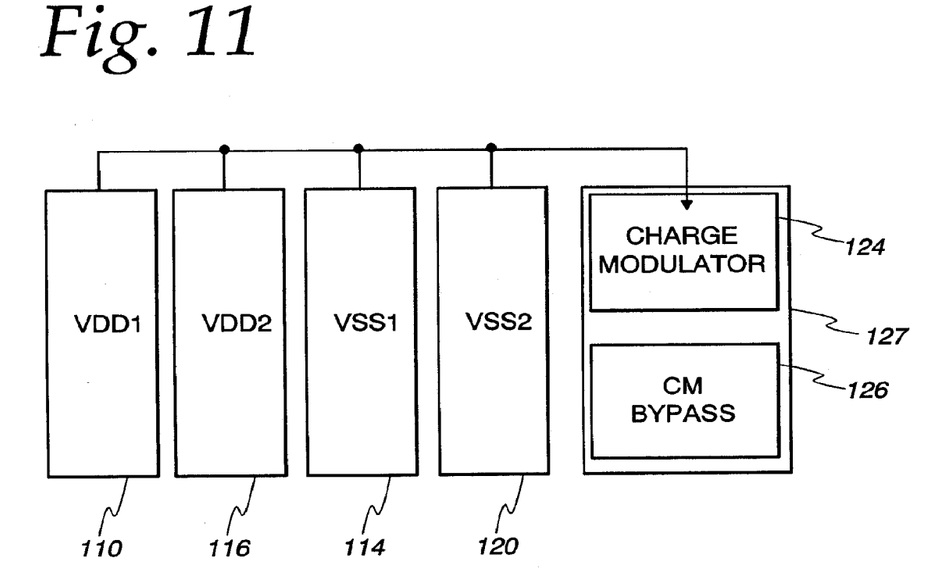
FIG. 11 is a block diagram of a chip architecture for an SOI chip with a charge modulation network.

Referring to FIG. 11, an example of a power book for chip architecture is illustrated. The charge modulation network 127 including the charge modulation circuit 124 and charge modulation network ESD bypass circuit 126 are provided as part of a support module for the driver bank.

Figure 12:
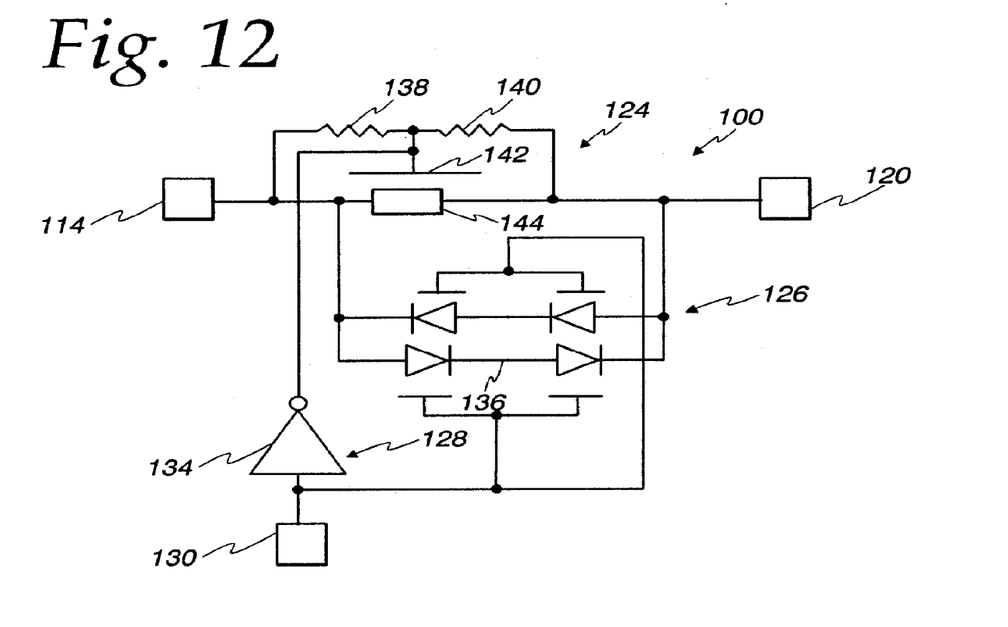
FIG. 12 is an electrical schematic similar to FIG. 10 with gate couple disable.
Figure 13:
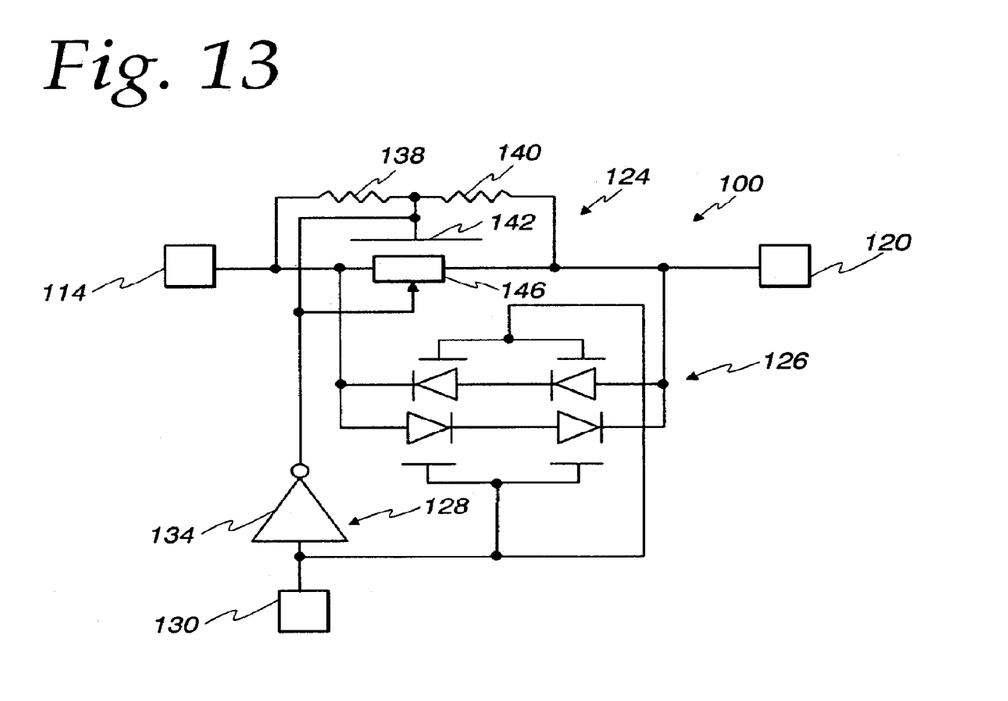
FIG. 13 is an electrical schematic similar to FIG. 10 with body and gate couple disable.
Figure 14:
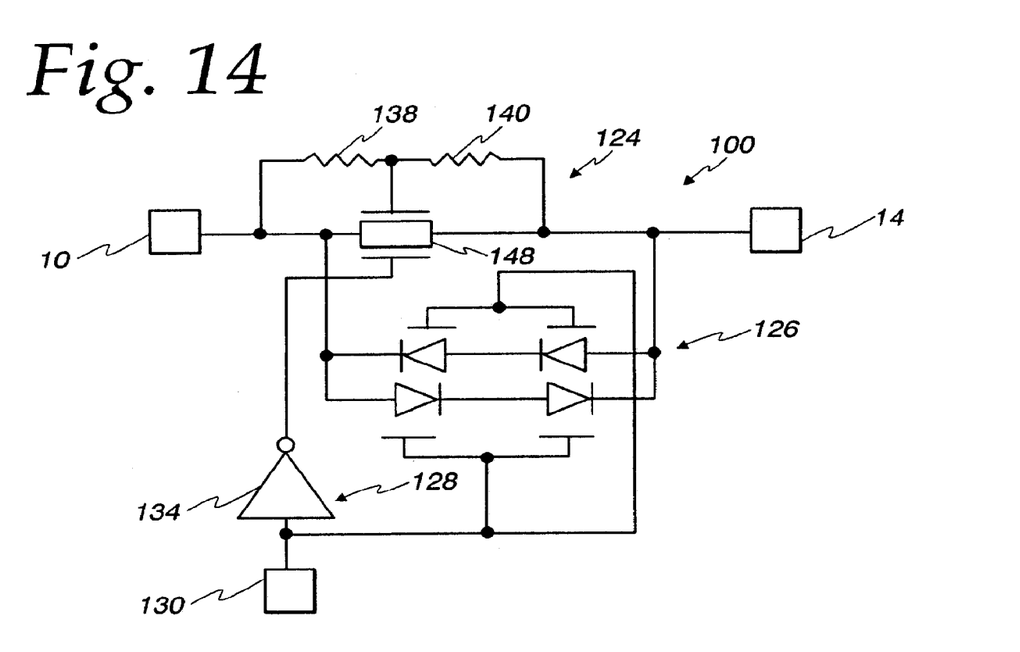
FIG. 14 is an electrical schematic similar to FIG. 10 with dual gate SOI.

Referring to FIGS. 12, 13 and 14, electrical schematics, similar to FIG. 10, are illustrated with different embodiments of the charge modulation circuit 124. Referring initially to FIG. 12, the charge modulation circuit 124 comprises series resistors 138 and 140 connected between the grounds 114 and 120. A junction between the resistors 138 and 140 is connected to the gate 142 of a FET 144. The FET 144 is connected between the grounds 114 and 120. The gate 142 is connected to the enable circuit 128. This implementation comprises charge modulation with gate couple disable as by gating the FET 144.

FIG. 13 is generally similar to FIG. 12 and illustrates a FET 144 including body and gate couple disable. FIG. 14 again is generally similar and includes a dual gate SOI FET 148.

In accordance with another aspect of the invention, a protective device, such as a diode, is added to connect the supplies at low metal levels to provide ESD protection. This provides a path for excess charge to flow. Insertion of such a localized device at the voltage planes prevents damage due to charging. The protective device may be a diode, set of diodes, or other structure that will allow current to flow when the potential across it exceeds operational voltages. The device must become active at voltage levels below levels that may damage gate oxide in devices such as in the circuit of FIG. 2.

Figure 15:
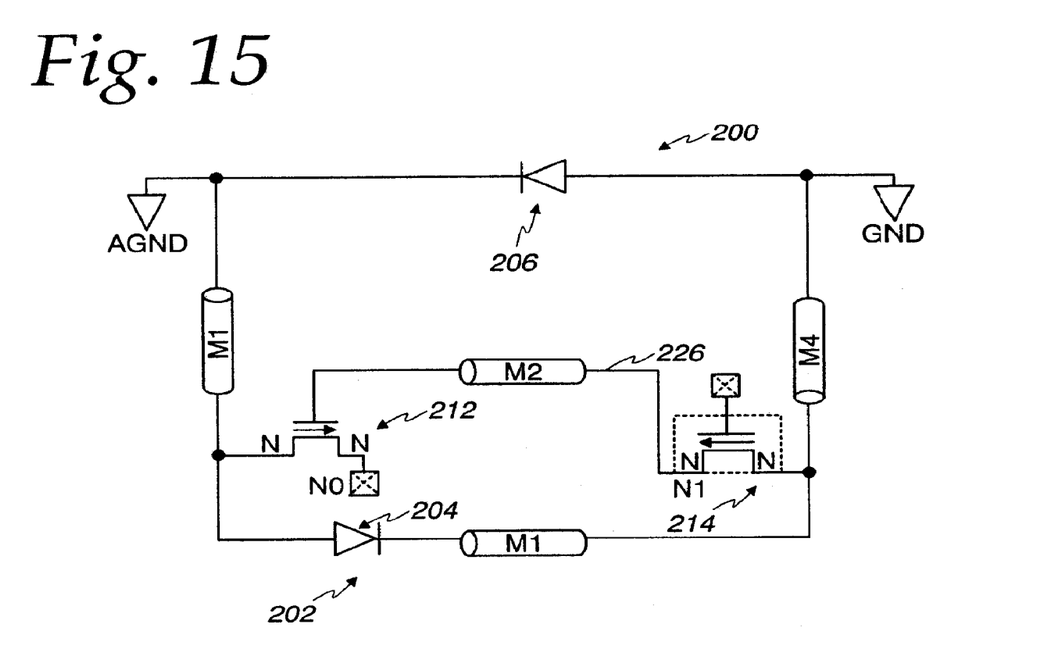
FIG. 15 is an electrical schematic of an ESD protection circuit in accordance with an alternative embodiment of the invention.

Referring to FIG. 15, an electrical schematic for an SOI integrated circuit 200 including an ESD protection circuit 202 is illustrated. Similar to FIG. 2, the integrated circuit 200 includes a first FET 212 and a second FET 214. The gate of the first FET 212 is connected by a conductor 226 at a wiring level M2. The drain of the first FET 212 is connected to a wiring level M1. The source of the second FET 214 is connected to wiring levels M1 and M4. The wiring level M4 is connected to a first ground labeled GND. The wiring level M1 is connected to a ground labeled AGND. The ESD protection circuit 202 comprises a pair of diodes 204 and 206 between the grounds GND and AGND in both directions.

Figure 16:
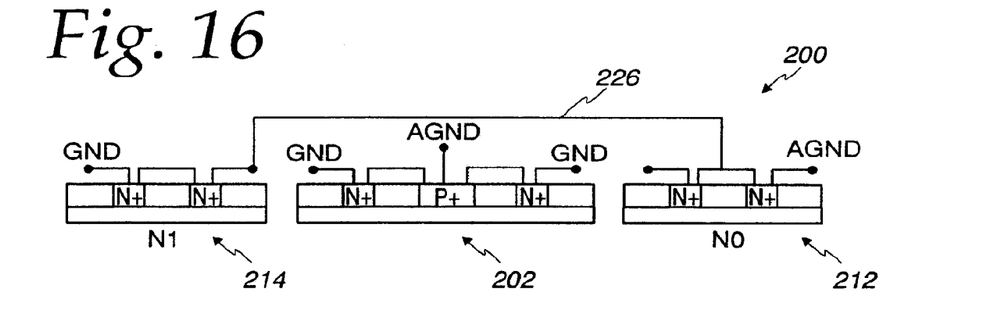
FIG. 16 is a cross section of an SOI chip for the schematic of FIG. 15.

FIG. 16 illustrates a cross section of the integrated circuit 200. As illustrated, the ESD protection circuit 202 is formed between the FETs 212 and 214 and is connected at low levels in the metal. Particularly, the protection device 202 connects a first power domain, represented by the first ground GND, and the second power domain, represented by the second ground AGND via a low metal layer to provide a discharge path for accumulated charge. Particularly, the low metal layer is at a metal level lower than or equal to the highest metal level on which the logic signal line 226 is routed to provide a discharge path for accumulated charge. This solution is well suited to system on chip (SOC) technology because of the use of multiple voltage islands and is advantageous in that it does not affect timing.

Figures 17, 17B:
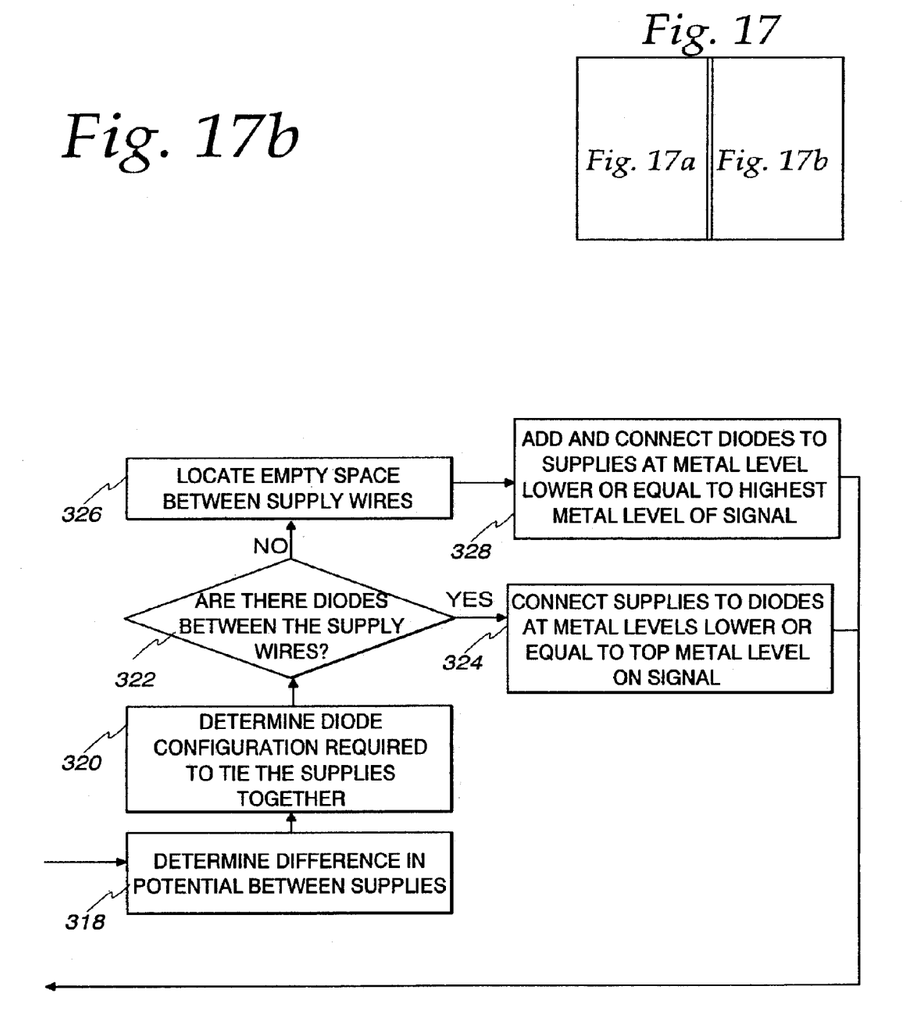
FIG. 17 is a block diagram illustrating a method of implementing electrostatic discharge protection in an SOI integrated circuit in accordance with the invention.
Figure 17A:
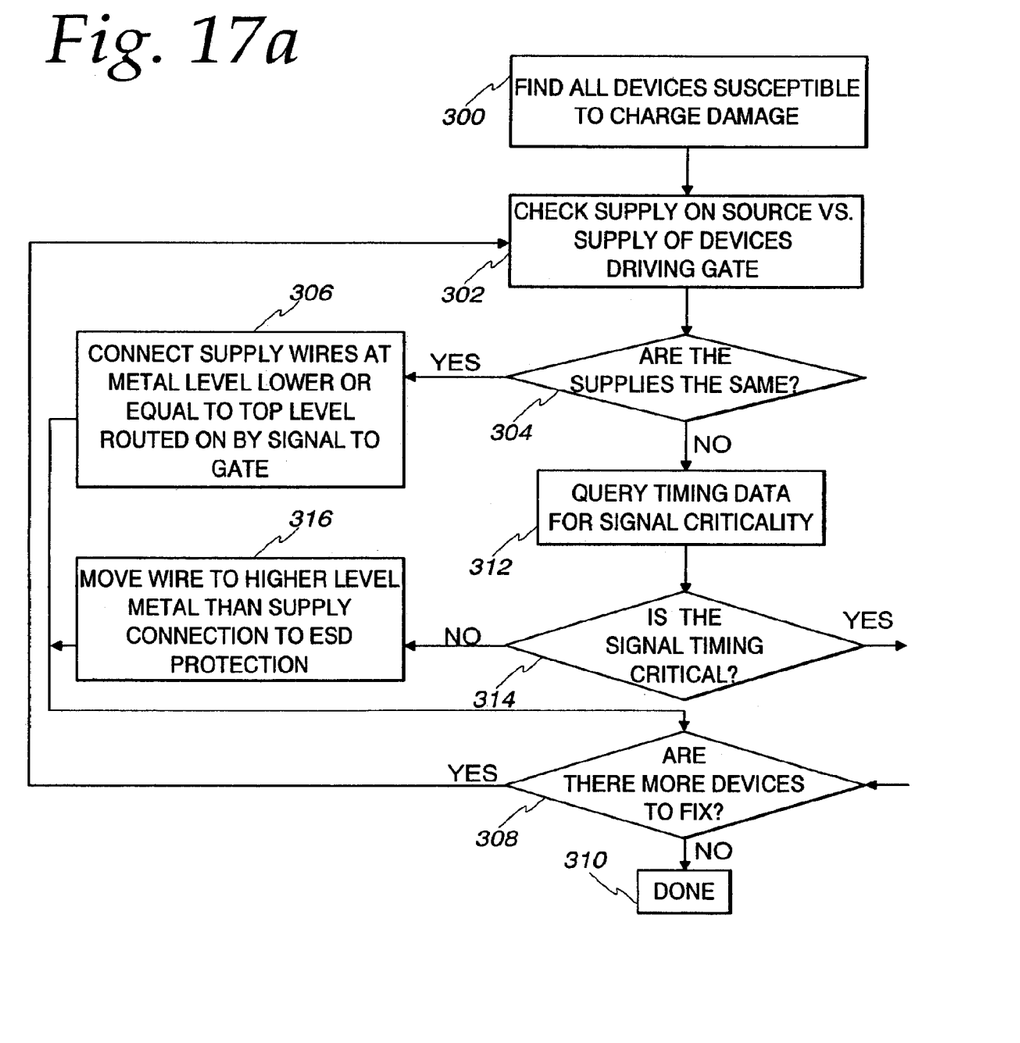

Referring to FIG. 17, the procedure or methodology is illustrated for integrating the described ESD protection into ASIC SOC voltage island design. The process begins at a block 300 which finds all devices in an SOI chip susceptible to charge damage. A block 302 checks the supply on source vs. supply of devices driving gates for each device. A decision block 304 determines if the supplies are the same. If so, then the supply wires are connected at a metal level lower or equal to the top level routed on by signals to the gate at a block 306. Thereafter, a decision block 308 determines if there are more devices to fix. If not, then the routine ends at a block 310. If so, then the process returns to the block 302.

If the supplies are not the same, as determined at the decision block 304, then a block 312 queries the timing data for signal criticality. A decision block 314 determines if the signal timing is critical. If not, then at a block 316 the wire is moved to higher level metal than supply connections to the ESD protection at a block 316 and the process advances to the block 308. If the signal timing is critical, then the connections should not be made at a higher level. A block 318 determines the difference in the potential between supplies. A block 320 determines diode configuration required to tie the different voltage supplies together. This is based on the maximum voltage to be handled. A decision block 322 determines if there are unused ESD elements, such as diodes, between the supply wires. The ESD elements could be lateral gated diodes, p+/n+ diode, p+/p−/n−/n+ diode, dynamic threshold MOSFET body- and gate-coupled diode, etc. If so, then the supplies are connected at a block 324 to diodes at metal levels lower or equal to a top metal level of the signal. If there are not free diodes, then a block 326 locates empty space between supply wires. A block 328 adds and connects the diodes to supplies at metal levels lower or equal to a highest metal level of the signal. From either block 324 or 328, the process proceeds to the block 308 to determine if there are more devices to fix. The described methodology can be implemented in software as part of the circuit design in an automated process.

Thus, in accordance with the invention, there are disclosed various embodiments for providing electrostatic discharge protection in a silicon-on-insulator integrated circuit.

What is claimed is:

1. A silicon-on-insulator (SOI) integrated circuit including electrostatic discharge (ESD) protection comprising:
   an SOI chip;
   a first power domain in the SOI chip;
   a second power domain in the SOI chip;
   an ESD protection device in the SOI chip electrically connecting the first power domain and the second power domain via a low metal layer to provide a discharge path for accumulated charge; and
   a logic signal line between the first and second power domains and wherein the ESD protection device electrically connects the first power domain and the second power domain at a metal level lower than or equal to the highest metal level on which the logic signal line is routed to provide a discharge path for accumulated charge.

2. The SOI integrated circuit of claim 1 wherein the ESD protection device comprises a diode.

3. The SOI integrated circuit of claim 1 wherein the ESD protection device comprises a plurality of diodes connected in opposite directions between the first power domain and the second power domain.

4. The SOI integrated circuit of claim 1 wherein the ESD protection device comprises a charge modulation network.

5. A method of implementing electrostatic discharge protection in a silicon-on-insulator (SOI) integrated circuit comprising:
   defining a plurality of SOI devices in the integrated circuit;
   identifying a plurality of power domains in the SOI integrated circuit;
   determining if a logic signal traverses more than one of the plurality of power domains;
   determining if a circuit path for the logic signal is timing critical; and
   connecting a power supply wire for an ESD protection network at a metal level lower than or equal to a highest metal level on which the logic signal is routed if the logic signal traverses more than one power domain and if the circuit path is timing critical.

6. The method of claim 5 wherein connecting a power supply wire for an ESD protection network comprises adding diodes to supplies at a metal level lower than or equal to a highest metal level on which the logic signal is routed.

7. The method of claim 5 further comprising determining if ESD elements are present between supply wires and if so connecting a power supply wire for an ESD protection network comprises connecting ESD elements to supplies at a metal level lower than or equal to a highest metal level on which the logic signal is routed.

8. A method of implementing electrostatic discharge protection in a silicon-on-insulator (SOI) integrated circuit comprising:
   defining a plurality of SOI devices in the integrated circuit;
   identifying a plurality of power domains in the SOI integrated circuit;
   determining if a logic signal traverses more than one of the plurality of power domains;
   determining if a circuit path for the logic signal is not timing critical; and
   connecting a power supply wire at a metal level higher than a metal level on which a power supply connection for the ESD protection network is routed if the logic signal traverses a single power domain or if the circuit path is not timing critical.

* * * * *